(12) United States Patent
Pearson (10) Patent No.: US 7,304,480 B1
(45) Date of Patent: Dec. 4, 2007

(54) RADIO MODE SELECTIVITY BLOCK FOR A DETECTOR FOR DETECTING A BURIED CURRENT CARRYING CONDUCTOR

(75) Inventor: Richard Pearson, Bristol (GB)

(73) Assignee: Radiodetection Limited, Bristol (GB)

( * ) Notice: Subject to any disclaimer, the term of this patent is extended or adjusted under 35 U.S.C. 154(b) by 0 days.

(21) Appl. No.: 11/455,788

(22) Filed: Jun. 20, 2006

(30) Foreign Application Priority Data

Jun. 20, 2005 (GB) ................. 0512567.9

(51) Int. Cl.
*G01V 3/08* (2006.01)
*H03B 21/02* (2006.01)

(52) U.S. Cl. ...................... 324/328; 331/38

(58) Field of Classification Search ......... 324/328, 324/326, 327, 329, 67; 331/37, 38, 39
See application file for complete search history.

(56) References Cited

U.S. PATENT DOCUMENTS

| | | | | |
|---|---|---|---|---|
| 4,196,391 A | * | 4/1980 | Weber | ................. 324/328 |
| 4,321,539 A | * | 3/1982 | Trump | ................. 324/328 |
| 6,617,856 B1 | * | 9/2003 | Royle et al. | ................. 324/329 |
| 6,777,923 B2 | | 8/2004 | Pearson | |

FOREIGN PATENT DOCUMENTS

| | | |
|---|---|---|
| GB | 2 400 674 | 10/2004 |
| GB | 2 400 994 | 10/2004 |
| GB | 2 412 738 | 10/2005 |
| WO | WO 03/069598 A1 | 8/2003 |
| WO | WO 03/069769 A2 | 8/2003 |
| WO | WO 03/071311 A1 | 8/2003 |

* cited by examiner

*Primary Examiner*—Reena Aurora
*Assistant Examiner*—David M Schindler
(74) *Attorney, Agent, or Firm*—Baker & Hostetler LLP (57) ABSTRACT

A radio mode selectivity block 41 for a detector 1 for detecting a buried current carrying conductor comprises a plurality of beat frequency oscillators 53 to center the bandwidth of detection of the detector 1 on target very low frequency (VLF) frequency bands. The frequencies of the beat frequency oscillators are chosen to fall within the VLF frequency bands used in a number of countries, so that the detector 1 can be used in radio mode in these countries without the need for local configuration.

6 Claims, 5 Drawing Sheets

RADIO MODE SELECTIVITY BLOCK FOR A DETECTOR FOR DETECTING A BURIED CURRENT CARRYING CONDUCTOR

The present invention relates to a radio mode selectivity block for a detector for detecting a buried current carrying conductor Before commencing excavation or other work where electrical cables, fibre optic cables or other utilities ducts or pipes are buried, it is important to determine the location of such buried cables or pipes to ensure that they are not damaged during the work. It is also useful to be able to track a path of buried cables or pipes. Current carrying conductors emit electromagnetic radiation which can be detected by an electrical antenna. If fibre optic cables or non-metallic utilities ducts or pipes are fitted with a small electrical tracer line, an alternating electrical current can be induced in the tracer line which in turn radiates electromagnetic radiation. It is known to use detectors to detect the electromagnetic field emitted by conductors carrying alternating current.

One type of such detector works in one of three modes. These modes are classified as either passive or active modes, the passive modes being 'power' mode and 'radio' mode. Each mode has its own frequency band of detection.

In power mode, the detector detects the magnetic field produced by a conductor carrying an AC mains power supply at 50/60 Hz, or the magnetic field re-radiated from a conductor as a result of a nearby cable carrying AC power, together with higher harmonics up to about 3 KHz. In radio mode, the detector detects very low frequency (VLF) radio energy which is re-radiated by buried conductors. The source of the original VLF radio signals is a plurality of VLF long wave transmitters, both commercial and military.

In the active mode, a signal transmitter produces an alternating magnetic field of known frequency and modulation, which induces a current in a nearby buried conductor. The signal transmitter may be directly connected to the conductor or, where direct connection access is not possible, a signal transmitter may be placed near to the buried conductor and a signal may be induced in the conductor. The buried conductor re-radiates the signal produced by the signal transmitter.

These systems are widely available and have been marketed by Radiodetection Ltd for some time under the trade marks 'C.A.T' and 'Genny'.

This invention provides further advancements to existing systems, providing additional functionality and benefits to the user. The detector achieves good performance in terms of sensitivity, dynamic range and selectivity. Typical parameters are $6\times10^{-15}$ Tesla sensitivity (referred to a 1 Hz bandwidth), 141 dB rms/$\sqrt{Hz}$ dynamic range, and a selectivity which allows 120 dB attenuation across a 1 Hz transition band. The detector can be digitally programmed to receive any frequency up to 44 kHz and processed through any defined bandwidth.

According to a first aspect of the invention there is provided a radio mode selectivity block for a detector for detecting very low frequency magnetic emissions from a buried current carrying conductor, the detector having magnetic sensors for converting the magnetic emissions into field strength signals and an analogue to digital converter for digitising the field strength signals, the radio mode selectivity block comprising: a plurality of beat frequency oscillators to centre the bandwidth of detection of the field strength signals of the detector on target very low frequency bands; summing means for summing the outputs of the beat frequency oscillators; and multiplying means for multiplying the output of the summing means with said digitised signal.

Preferably a first beat frequency oscillators oscillates at a frequency between 17536 Hz and 20992 Hz, and a second beat frequency oscillators oscillates at a frequency between 20992 Hz and 24448 Hz.

Preferably the first beat frequency oscillators oscillates at a frequency between 18400 Hz and 20128 Hz, and the second beat frequency oscillators oscillates at a frequency between 21856 Hz and 23584 Hz.

Preferably the first beat frequency oscillators oscillates at a frequency of 19264 Hz and the second beat frequency oscillators oscillates at a frequency of 22720 Hz.

Preferably a third beat frequency oscillator oscillates at 24700 Hz.

According to a second aspect of the invention there is provided a detector for detecting a buried current carrying conductor comprising: magnetic sensors for converting magnetic emissions from the conductor into field strength signals; an analogue to digital converter for digitising the field strength signals; and a radio mode selectivity block as described above, arranged to process the field strength signals of the detector.

The present invention can be implemented either in hardware or in software in a general purpose computer. Further, the present invention can be implemented in a combination of hardware and software. The present invention can also be implemented by a single processing apparatus or a distributed network of processing apparatuses.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilised as a basis for the designing of other structures, methods and systems for carrying out the several purposes of the present invention.

Embodiments of the invention will now be described by way of example, with reference to the accompanying drawings, in which.

Figure 1:
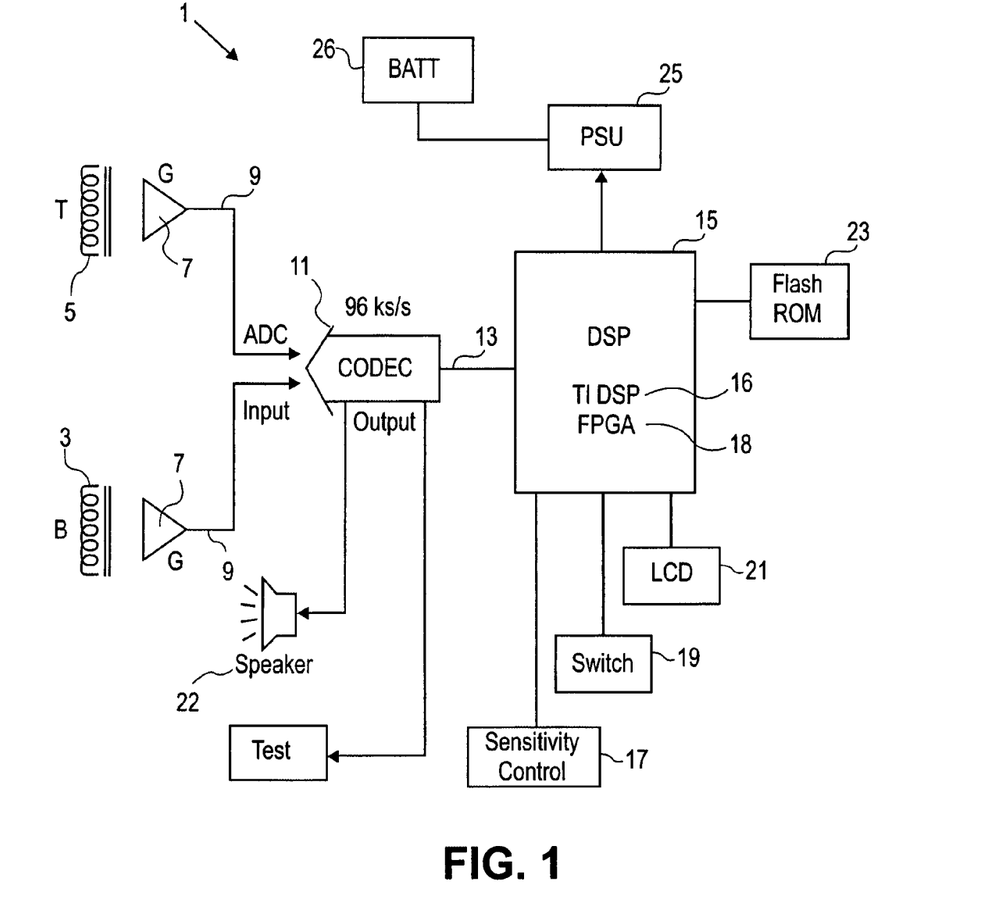
FIG. 1 is an overall block diagram of the detector for detecting a buried current carrying conductor embodying the invention.

Referring to FIG. 1, a detector 1 has two vertically spaced antennae, namely a bottom antenna 3 and a top antenna 5 within an elongate vertically held housing (not shown) configured to be moveable manually by an operator using a handle. The antennae 3, 5 are arranged with their axes parallel and spaced apart so that in use the bottom antenna 3 will be directly below the top antenna 5, their axes being horizontal. Each antenna 3, 5 produces an electrical signal which is fed into a respective one of two amplifiers 7. The amplifier outputs are field strength signals 9 which are fed into a CODEC 11.

Each of the antennae 3, 5 has a noise floor. Each electrical signal from the antennae 3, 5 is fed to its respective amplifier 7 to lift the magnetic sensor noise floor above an intrinsic quantisation noise of the CODEC 11, this being referred to the bandwidth of one or more of the frequency bands of detection. The output of each amplifier 7 is fed into the CODEC 11.

The antennae 3, 5 used are high sensitivity ferrite windings. Other magnetic sensors may be used such as Hall effect sensors or flux gate magnetometers.

The CODEC 11 is a 24-bit stereo delta-sigma analogue to digital converter (ADC). This is a relatively cheap device which is commonly used in the audio industry. In Radiodetection Limited's product marketed under the 'RD4000' trade mark, pre-selective filtering, multiple switch gain stages and a phase sensitive heterodyne circuit are used between the antennae and the ADC. The present invention does not use pre-selective filtering, multiple switch gain stages or a phase sensitive heterodyne circuit between the antennae and the ADC, hence reducing the number of components. In other prior art cable detectors, more sophisticated and consequently more expensive ADC are used, as the absolute accuracy of the device measurements is important.

The CODEC 11 used in this embodiment has an absolute accuracy of ±5%, however the way that the CODEC 11 is used makes it an ideal ADC for this application. High dynamic range negates the requirement for multiple gain stages. The high dynamic range is achieved by massively oversampling the bandwidth of detection—the noise shaping aspect of the audio CODEC 11 being an ideal application for this principal.

Notwithstanding the poor absolute accuracy of this audio-grade stereo ADC, the present embodiment benefits from the fact that the detector 1 calculates the depth of a buried conductor by processing and comparing the signals received from the two antennae 3, 5. Therefore, any absolute inaccuracy in the sampling of the CODEC 11 is overcome by comparing the two processed signals. Using this CODEC 11 as a ratiometric device provides a significant cost reduction, without compromising overall performance of the detector 1.

The CODEC 11 oversamples the field strength signals 9 at up to 96 KHz. The output 13 of the CODEC 11 is fed into a digital signal processing block 15, which is comprised of a digital signal processor 16 (DSP) and a field programmable gate array 18 (FPGA).

The DSP 16 primarily has three tasks. Firstly, it is responsible for defining the selectivity of the detection frequency bands. Secondly, it manages the audio and video outputs of the detector. Thirdly, it provides general control functions to other components of the detector 1.

More details of the operation of the DSP's tasks are provided in Radiodetection Limited's applications published as WO 03/071311, WO 03/069598, WO 03/069769, GB 2400994 and GB 2400674, which are incorporated herein by reference.

Significant benefits are derived from ultra-narrow bandwidth processing, noise typically scaling with the square of bandwidth. The detector 1 processes in several frequency bands simultaneously, allowing ballistic response functions, such as the general locate task, to co-exist with narrow bandwidth functions, such as depth computation. The depth computation task computes in a 1 Hz bandwidth at any frequency up to 44 kHz, the out-of-band rejection being around −120 dB.

Phase tracking is an essential feature to allow the narrow bandwidth tasks to lock-on to the carrier frequency, the potential error between transmitter and receiver clocks being well in excess of the signal bandwidth. In the case of the active mode, the transmitted signal may be 100% amplitude modulated and the depth calculation task has to position itself exactly on the carrier without cross-talk from the side-bands (located at ±6 Hz around the 32,768 Hz carrier).

The phase tracking algorithm is a natural development of processes described in Radiodetection Limited's UK application no. 0407372.2. Essential signal to noise ratio (SNR) measurements are made on the carrier and side-bands and checks performed to ensure the tracking algorithm does not wander off on any high order harmonics due to power-line transmissions. SNR is quantified from both magnitude and second derivative phase information; all results are correlated from both antennae 3, 5. In the case of an SNR less than 10 dB, the depth calculation task is disabled, thus ensuring only accurate information is presented to the user.

The concept of spectral recognition is applied to the active signal when it is in pulsed mode operation. This idea is a simple application of the algorithms described in Radiodetection Limited's UK application no. 0407372.2 and involves a spectral assessment of the carrier and AM sidebands. The assessment is a Discrete Fourier Transform (DFT) convolution and measurement of the SNR. The DFT itself moves with the tracking algorithm and locks on to the carrier frequency.

The combination of these methods ensures that the detector 1 achieves the best possible signal integrity and depth accuracy.

User control of the detector 1 is provided by means of a sensitivity control 17 and a switch 19. The switch 19 is used to set the mode of operation of the detector 1. For example, the detector 1 can be set to operate in radio, power or active mode. The active mode is chosen when a dedicated signal generator is used in proximity to the cable which is to be detected, the signal generator inducing an alternating current in the conductor which re-radiates a magnetic signal. The signal generator operates at a preset frequency and with a preset modulation which is identified by the detector 1. A further position of the switch 19 is 'avoidance' mode, the operation of which is explained below.

The sensitivity control 17 is used to vary the gradient sensitivity of the antennae 3, 5. High sensitivity is initially used to detect the presence of a weak signal produced by a current carrying conductor. Once the presence of a conductor has been established, the sensitivity control 17 is varied to decrease the sensitivity of the detector 1 and the detector 1 is used to more precisely determine the location of the concealed current carrying conductor. This method of profiling the locate window as a function of sensitivity is described in Radiodetection Limited's application published as U.S. Pat. No. 6,777,923, which is incorporated herein by reference.

A liquid crystal display (LCD) 21 is provided in the housing surface to display such information as the mode of operation of the detector, the battery status, the depth of a conductor and/or the strength of the detected signal. Other user display devices can be used, as will be apparent to the skilled person.

The detector 1 also comprises a flash ROM 23, in which software is stored, and a power supply unit (PSU) 25. A key requirement of the detector 1 is that it must be portable.

Therefore, batteries 26 are used to power the detector 1, in this case two 'D'-type batteries, each providing a nominal 1.5V.

In use, the detector 1 is powered up and software is loaded from the flash ROM 23 into the digital signal processing block 15. A user adjusts the switch 19 to select the mode of operation. The selection will be either radio mode, power mode, active mode or avoidance mode. A depth threshold alarm function is active in power mode, active mode and avoidance mode. In avoidance mode the depth threshold alarm function only operates on frequencies in the frequency bands of power mode and active mode. The depth threshold alarm function is detailed below.

When the detector 1 is in proximity to a current carrying conductor, a current is induced in the bottom and top antennae 3, 5. The current induced in each of the antennae 3, 5 is amplified by a respective amplifier 7. The outputs 9 from the amplifiers 7 are field strength signals of the two antennae 3, 5. These signals are input to the CODEC 11 which samples these signals at up to 96 kilo samples per second. The digitised signals 13 are fed to the digital signal processing block 15. The DSP 16 of the digital signal processing block 15 isolates signals of target frequency bands, depending on the mode of operation. If the DSP detects the presence of a current carrying conductor an audio and/or visual alarm is triggered on the speaker 22 and/or indicator 21.

Figure 2:
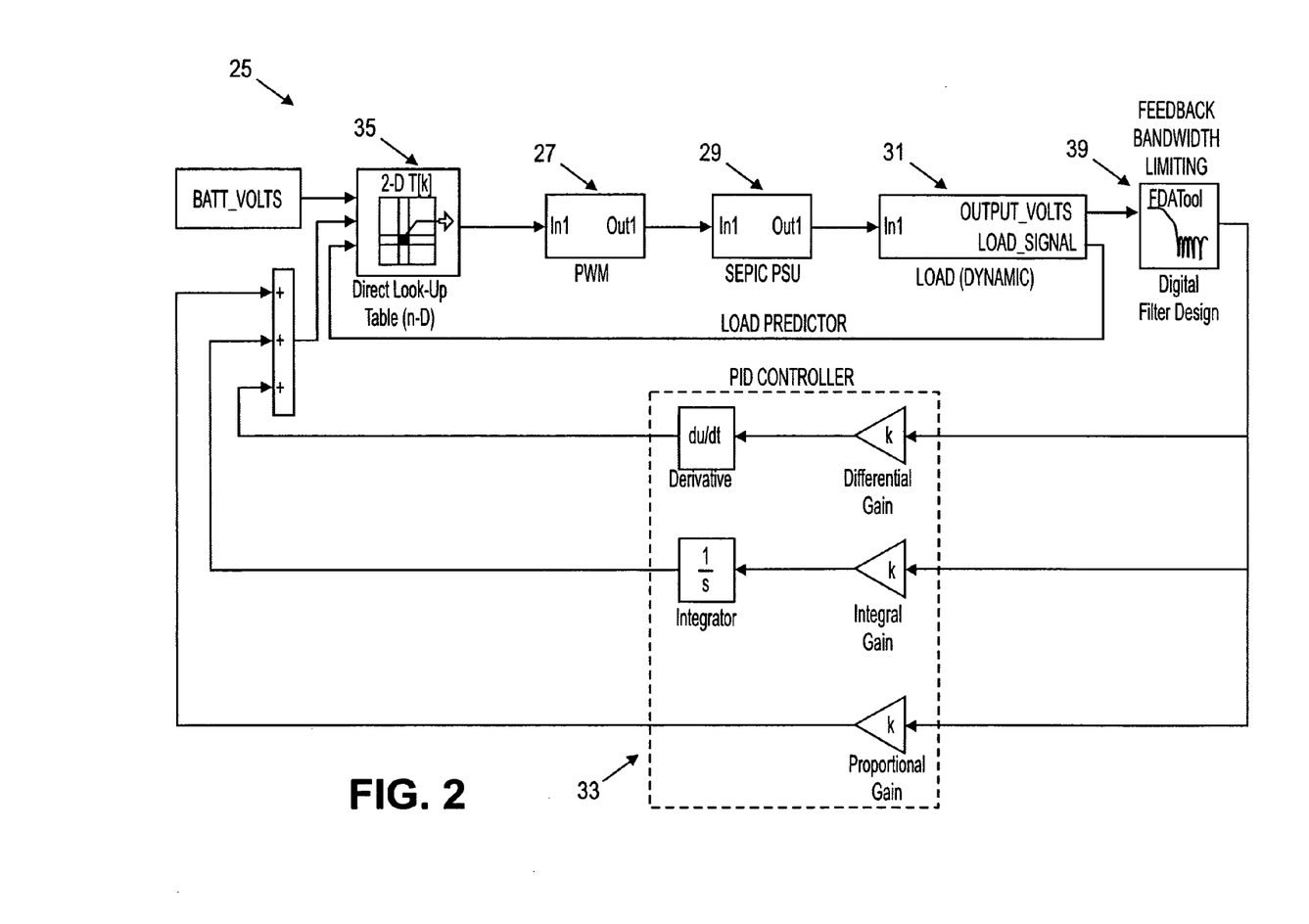
FIG. 2 is a block diagram of the power supply unit of the detector of FIG. 1.

Referring to FIG. 2, the PSU 25 has been designed to reduce self-generated noise which would otherwise interfere with the locate sensitivity and selectivity of the detector 1. The interference mechanism is either conducted on the power rails or radiated as a magnetic field. The space constraints of the detector 1 mean that there is an inevitable coupling of unwanted signals from the auxiliary electronics into the antennae. By carefully managing the electromagnetic emissions of the PSU 25, various benefits are achieved. For example, prior art digital detectors have operated as heterodyne or super-heterodyne receivers, wherein the bandwidth of operation of the DSP is shifted away from the baseband signal. This shifting is required in order to avoid electromagnetic interference between the auxiliary electronics and the signal detectors and employs a significant proportion of the processing capacity of the DSP. In the present invention, as this capacity has been freed up by operating the detector 1 as a homodyne receiver, the surplus capacity is used for other functions, as is explained below.

The PSU 25 is a switched mode power supply which is managed by a microprocessor, in this case the DSP 16. The PSU 25 provides regulated rails at 12 V, +3.3 V and −3.3 V. The input voltage of the PSU 25 decreases as the batteries 26 deteriorate. The load 31 is dynamic, primarily due to the varying current drawn by the speaker 22. The speaker output varies greatly as a current carrying conductor is detected. The current drawn by the other components also fluctuates.

The PSU 25 is comprised of a pulse width modulator (PWM) 27 which is controlled by the DSP 16. The output of the PWM 27 is fed into a single ended primary induction controller (SEPIC) 29 which is driven at exactly four times the CODEC sampling frequency, i.e., at up to 384 KHz. This ensures that the primary harmonic falls on a natural zero of the CODEC 11 and DSP 16, as is known in the art. The three regulated rails produced by the SEPIC 29 feed the dynamic load 31 of the detector 1, i.e., the components of the detector 1.

The SEPIC 29 is controlled on both edges so that the DSP 16 has full authority control on all of the electromagnetic emissions produced by the PSU 25. In this way, the DSP 16 is able to eliminate any unwanted power harmonics which would overlap the frequency bands of detection.

A proportional integral differential (PID) controller 33 feedback algorithm is used to control the PSU 25. The feedback bandwidth is constrained by the requirements of noise avoidance so that none of the higher order power switching harmonics interfere with the locate frequency bands. The regulated voltages are filtered by a filter 39 and are fed into the PID controller 33. The outputs of the PID controller 33 are combined and are provided as an input to a lookup table 35. The voltage of the batteries 26 is also provided as an input to the lookup table 35. A further contribution to the control function can be a load predictor which offsets the duty cycle of the SEPIC 29 in response to an abrupt change in load, typically an increased audio demand. This load predictor function is provided by the DSP 16 which has knowledge of the load which will be required by some of the components, in particular the speaker 22. The load drawn from the PSU 25 typically varies between 600 and 1500 mW.

The inputs to the lookup table 35 are the battery supply voltage, the load predictor and up to three feedback contributions. The output is the duty cycle of the primary switch. The purpose of the lookup table 35 is to ensure that the spectral components of the PSU 25 that result from the regulation process cannot overlap the frequency bands of detection. This results in a discontinuous function which may hop from one duty cycle to another as an abrupt change rather than a continuous greyscale of regulation. The specific nature of the lookup table 35 is tailored to the mode of operation.

By using a PID controller 33 and a lookup table 35 the need for a proprietary switching regulator is eliminated, thereby reducing the cost of the detector 1. The SEPIC 29 is a switching converter the output of which is almost a linear function of the duty cycle. The feedback control law 33 is constrained to a bandwidth of roughly 1.5 KHz. A boot-strap oscillator is needed to start the SEPIC 29 before the DSP 16 can take control.

In alternative embodiments other combinations of PID feedback mixing may be used. For example, the feedback law 33 may be a standard proportional control (with hysteresis), i.e., with zero integral and derivative feedback gain. The control algorithm used is dependent on the mode of operation.

By controlling the self-generated noise of the PSU 25, the detector benefits from an improved SNR, thereby improving the sensitivity and selectivity of the detector 1.

Figure 3A:
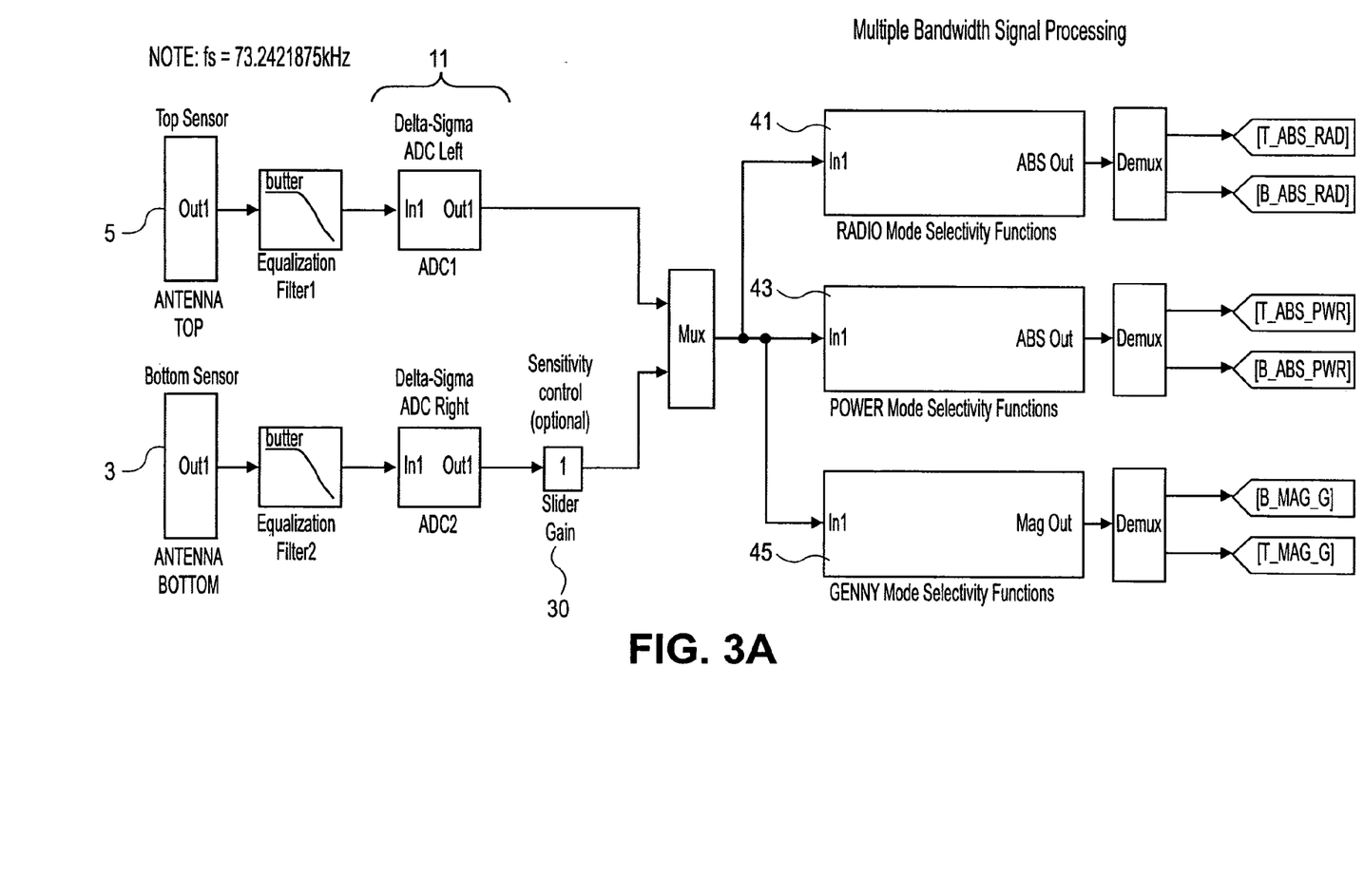
FIGS. 3a and 3b are block diagrams of the avoidance mode system of the detector of FIG. 1.
Figure 3B:
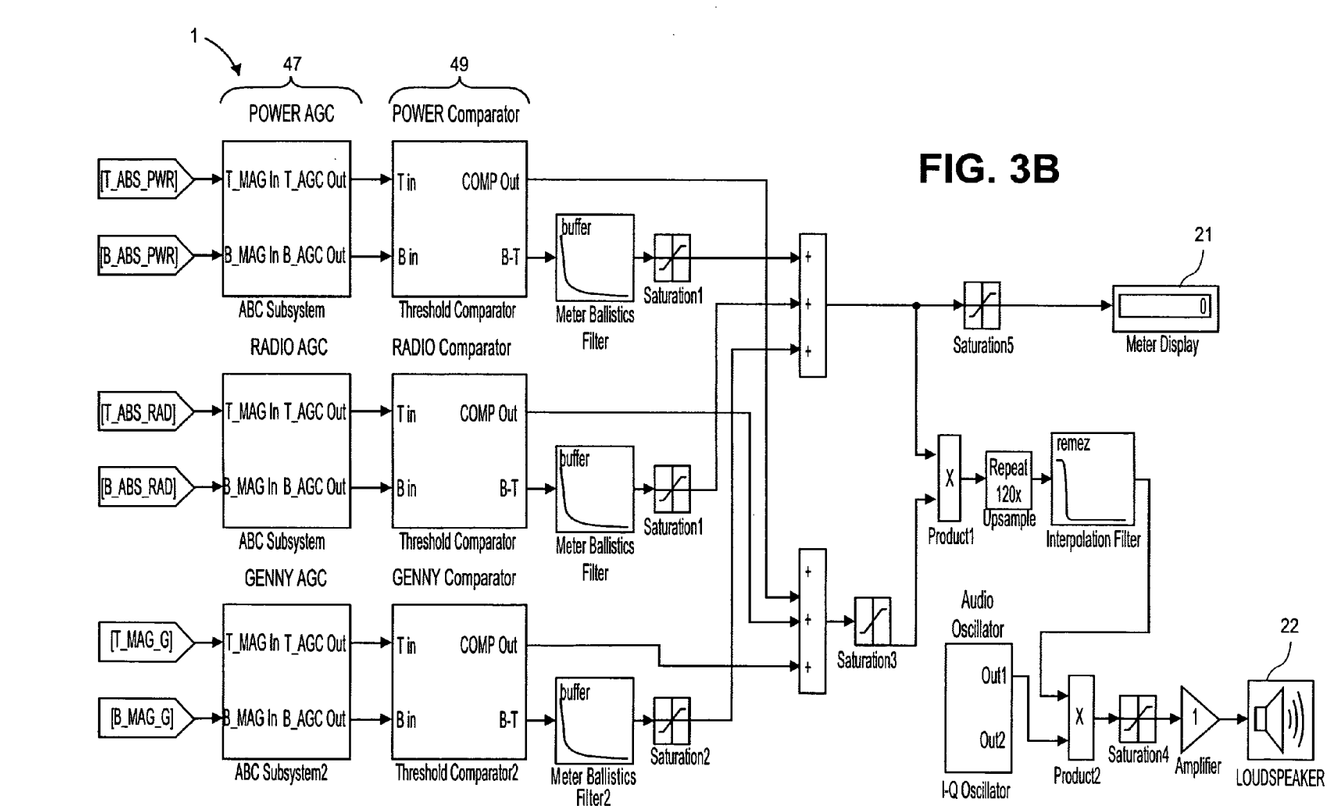

FIGS. 3a and 3b shows a more detailed block diagram of the detector 1 showing the 'avoidance' mode system, which is implemented in the detector 1. As mentioned above, three dedicated operating modes are available, namely one active and two passive modes. When existing detectors are used to check an area for a buried conductor, it is necessary to sweep the area three times, each time with the detector in a different mode.

The detector 1 of this invention combines the dedicated active and passive operating modes into a single mode, known as avoidance mode, to locate buried conductors in a single sweep, thereby saving time. If necessary, one or more of the dedicated modes can be used at a later stage to identify the exact location of a buried conductor. The three modes operate simultaneously, sharing the pair of antennae 3, 5 and a common detection indicator 21 and speaker 22. The detection sensitivity 30 is normally set to maximum, but can be set at a lower level.

The CODEC 11 is clocked at 73.242 KHZ. The DSP 16 processes the field strength signals produced by the antennae 3, 5 and simultaneously isolates signals of each of the three frequency bands corresponding to the three modes of operation in three mode selectivity blocks 41, 43, 45.

In existing detectors, the DSP is only capable of processing one mode at a time, primarily due to processing and power constraints, and their heterodyne architecture. However, according to this embodiment the DSP 16 is able to process each of the signals simultaneously due to the capacity which has been freed up as a result of efficiencies elsewhere in the system, for example, the ability of the detector 1 to operate as a homodyne receiver.

Signal outputs from the DSP 16 corresponding to the different modes of operation are fed into automatic gain controllers 47 (AGCs), such as the AGC described in Radiodetection Limited's application published as U.S. Pat. No. 6,777,923, which is incorporated herein by reference. The output of each of the AGCs 47 is converted to a detection signal in comparators 49. The detection signals are combined and used to provide an audio output from a speaker 22 and/or a visual signal on an indicator 21, for example on the LCD.

The detector 1 continually calculates the estimated depth of a buried conductor. If the depth of a buried conductor is calculated as less than a preset threshold, e.g. 30 cm, an audio and/or visual alarm is triggered to alert the operator of a shallow conductor. Such shallow conductors are of particular interest as there is an increased risk of hitting a shallow conductor when excavating an area.

In order to optimise the user interface of the detector, when calculating the depth of a conductor, the DSP 16 processes signals in three frequency bands simultaneously to tailor the manner in which information is presented to the user. The depth of the conductor is calculated in a 1 Hz bandwidth; the visual display is processed in a 10 Hz bandwidth so that the flicker of the display is at an acceptable level; and the processing of the audio alert is performed at 35 Hz, to ensure that the pulsing tone is clearly audible.

This depth threshold alarm function is active in the power mode and active mode of operation. It is also active in the avoidance mode but only operates for the frequency bands used in the power and active modes. The depth of a buried cable is calculated by comparing the strength of the signals received at the two antennae 3, 5 as shown below.

The bottom antenna signal $E_b(w)$ and top antenna signal $E_t(w)$ as a function of horizontal offset w of the detector from the conductor are given by:

$$E_b(w) := \frac{k.a}{a^2 + w^2} \text{ and } E_t(w) := \frac{k(x+a)}{W^2 + (x+a)^2}$$

where k is a magnetic constant; x is the distance between the antennae; and a is the vertical distance above the current carrying conductor. The depth of the current carrying conductor is given by:

$$d(w) := \left| \frac{x}{\frac{E_b(w)}{E_t(w)} - 1} \right|$$

The depth threshold alarm function is given by:

$$SA(w) := \begin{vmatrix} 1 & \text{if } \left| \frac{E_b(w)}{E_t(w)} \right| \geq T_d \\ 0 & \text{otherwise} \end{vmatrix}$$

where $T_d$ is the depth threshold constant which is dependent on the desired depth above which the alarm is triggered.

If $SA(w)=1$, the audio and/or visual alarm is triggered. A more accurate depth measurement can then be achieved by accurately pinpointing the location of the buried conductor by altering the sensitivity of the detector 1, as described above.

This method involves a careful interleaving of the depth threshold alarm function into the locate profile as governed by the depth a and horizontal offset w of the conductor and the sensitivity of the detector 1.

When the detector 1 is located directly above a current carrying conductor, the difference between the signals induced in the antennae 3, 5 is a maximum. As the detector 1 is moved away from the conductor the magnitude of the difference initially falls off and then rises again to a second peak. This is the case as the detector is moved in either direction perpendicular to the conductor. Hence, there is a main peak in the difference between the signals induced in the antennae 3, 5 when the detector 1 is directly above a current carrying conductor and there are two smaller peaks when the detector 1 is horizontally displaced from the conductor.

It is possible that when a detector 1 evaluates the depth threshold alarm function, the depth alarm may be triggered when the detector 1 is directly above the conductor and when the detector is moved either side of the detector 1, coinciding with the smaller peaks which are horizontally displaced from the conductor. An experienced user can distinguish between the main central peak and the two smaller side peaks, by moving the detector 1 through each of the three locations in which the depth threshold alarm is triggered, as the central location corresponds to the position above the conductor.

Conventionally, radio mode uses a beat frequency oscillator (BFO) to centre the bandwidth of detection on the target VLF spectrum. The specific frequencies at which VLF transmissions are transmitted vary from one country to another. The conventional approach requires the BFO to be tuned to a specific frequency dependent on the geographical location.

Figure 4:
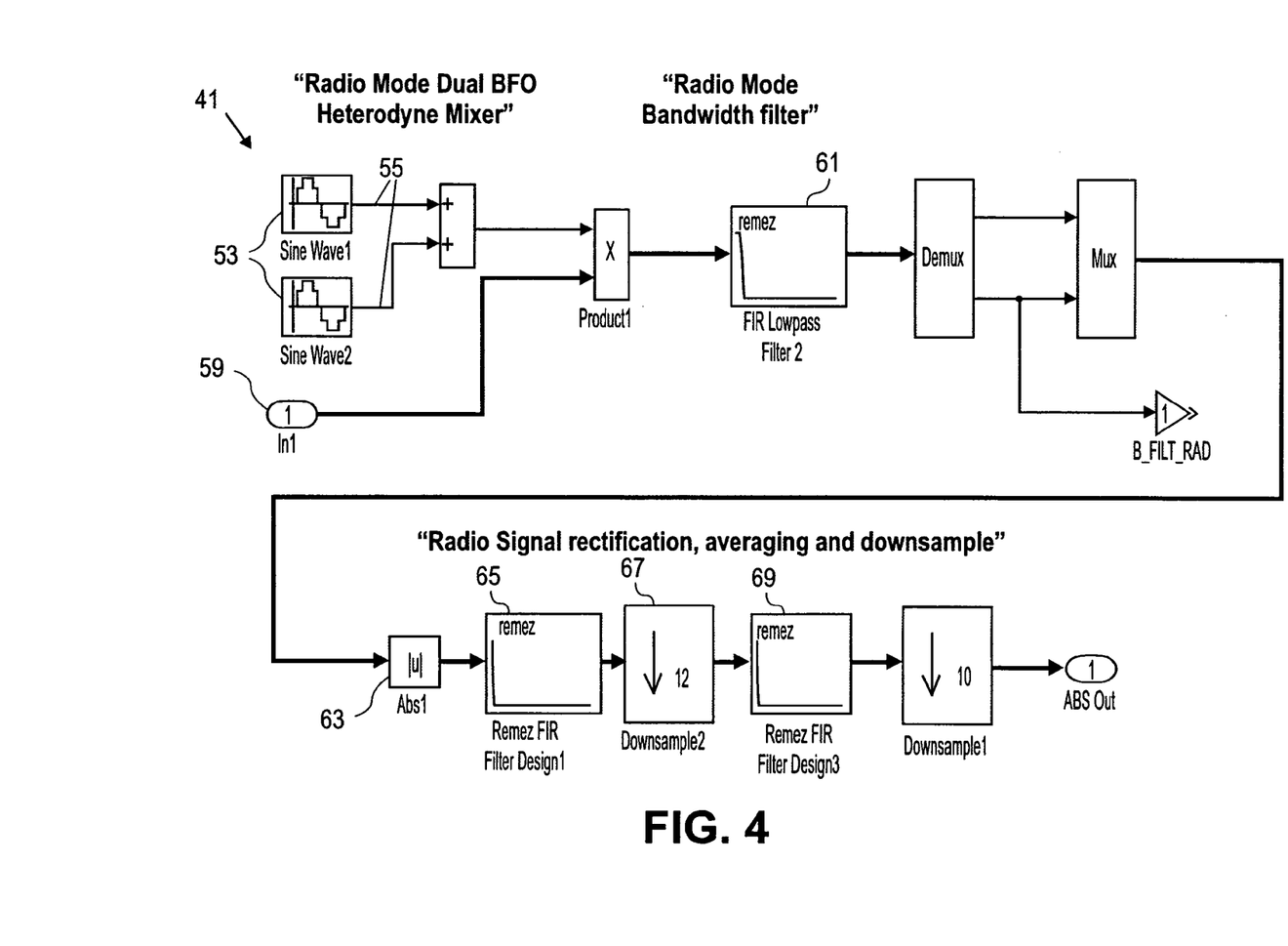
FIG. 4 is a block diagram of the radio mode selectivity block of the avoidance mode system of FIG. 3b.

This embodiment achieves a 'universal' radio mode by combining the outputs of signals processed through a plurality of BFOs. The advantage of this approach is that the detector 1 works in a large number of countries and can be provided in these countries without the need for local configuration, thereby saving on cost and time of deployment. The combined BFO approach has been achieved without a loss of performance.

The source of the inputs of the radio mode selectivity block is energy from VLF transmission stations in the frequency band 16 KHz to 39 KHz. Referring to FIG. 4, the block 41 superimposes signals 55 from a plurality of BFOs 53 into a common algorithm, thus encompassing the entire spectrum without loss of performance in the referred signal to noise ratio. This algorithm is very similar to all previous algorithms other than the concept of having a plurality of BFOs. The BFOs 53 sum on a common mode junction 57, the output of which is multiplied with the signal 59 that is output from the CODEC 11. A low pass filter 61 determines the overall bandwidth detection, which is typically 10 KHz, and also rejects the trigonometric sum term which is intrinsic to the modulation.

If two BFOs 53 are used, their frequencies are chosen within the ranges of 17536 Hz to 20992 Hz and 20992 Hz to 24448 Hz. Preferably their frequencies are chosen within the ranges of 18400 Hz to 20128 Hz and 21856 Hz to 23584 Hz. In this embodiment the frequencies of the two BFOs 53 are chosen in the middle of these ranges, i.e. at 19264 Hz and 22720 Hz. A further preferred frequency range is around 24700 Hz and further BFO frequencies may be selected to provide improved local coverage. By operating the plurality of BFOs 53 at these carefully selected frequencies, the detector can detect in radio mode in a large number of countries.

The remainder of the signal processing of the radio mode selectivity block 41 is unchanged from previous architectures for processing radio mode signals. This comprises a rectifier 63, subsequently a low-pass filter 65, a down-sampling stage 67 and a further low pass filter 69. This cascaded down sampling and low pass filtering exists to decimate the bandwidth down from the sampling rate of roughly 73 kilo samples per second to about 610 samples per second, with an overall response bandwidth close to 10 Hz, that being the ballistic response bandwidth for radio mode. Various modifications will be apparent to those in the art and it is desired to include all such modifications as fall within the scope of the accompanying claims.

The invention claimed is:

1. A radio mode selectivity block for a detector for detecting very low frequency magnetic emissions from a buried current carrying conductor, the detector having magnetic sensors for converting the magnetic emissions into field strength signals and an analogue to digital converter for digitising the field strength signals, the radio mode selectivity block comprising:

a plurality of beat frequency oscillators to centre the bandwidth of detection of the field strength signals of the detector on target very low frequency (VLF) frequency bands;

summing means for summing the outputs of the beat frequency oscillators; and multiplying means for multiplying the output of the summing means with the digitised field strength signals.

2. A radio mode selectivity block as claimed in claim 1, wherein a first beat frequency oscillators oscillates at a frequency between 17536 Hz and 20992 Hz, and a second beat frequency oscillators oscillates at a frequency between 20992 Hz and 24448 Hz.

3. A radio mode selectivity block as claimed in claim 2, wherein the first beat frequency oscillators oscillates at a frequency between 18400 Hz and 20128 Hz, and the second beat frequency oscillators oscillates at a frequency between 21856 Hz and 23584 Hz.

4. A radio mode selectivity block as claimed in claim 3, wherein the first beat frequency oscillators oscillates at a frequency of 19264 Hz and the second beat frequency oscillators oscillates at a frequency of 22720 Hz.

5. A radio mode selectivity block as claimed in claim 2, wherein a third beat frequency oscillator oscillates at 24700 Hz.

6. A detector for detecting a buried current carrying conductor comprising:

magnetic sensors for converting magnetic emissions from the conductor into field strength signals;

an analogue to digital converter for digitising the field strength signals; and a radio mode selectivity block according to any one of the preceding claims, arranged to process the field strength signals of the detector.

\* \* \* \* \*